(12) United States Patent
Varanasi

(10) Patent No.: US 10,120,753 B2
(45) Date of Patent: Nov. 6, 2018

(54) METHODS AND APPARATUSES FOR ERROR CORRECTION

(71) Applicant: MICRON TECHNOLOGY, INC., Boise, ID (US)

(72) Inventor: Chandra C. Varanasi, Broomfield, CO (US)

(73) Assignee: Micron Technology, Inc., Boise, ID (US)

( * ) Notice: Subject to any disclaimer, the term of this patent is extended or adjusted under 35 U.S.C. 154(b) by 114 days.

(21) Appl. No.: 14/721,913

(22) Filed: May 26, 2015

(65) Prior Publication Data

US 2016/0350184 A1  Dec. 1, 2016

(51) Int. Cl.
| | | |
|---|---|---|
| *G11C 29/00* | (2006.01) | |
| *G06F 11/10* | (2006.01) | |
| *G11C 29/52* | (2006.01) | |
| *H03M 13/15* | (2006.01) | |
| *G11C 29/42* | (2006.01) | |
| *G11C 16/06* | (2006.01) | |
| *G11C 29/04* | (2006.01) | |

(52) U.S. Cl.
CPC .......... *G06F 11/1072* (2013.01); *G11C 29/42* (2013.01); *G11C 29/52* (2013.01); *H03M 13/152* (2013.01); *H03M 13/154* (2013.01); *G11C 16/06* (2013.01); *G11C 2029/0411* (2013.01)

(58) Field of Classification Search
CPC ............ G06F 11/1068; H03M 13/455; H03M 13/373; H03M 13/13; H03M 13/00; H03M 13/15
See application file for complete search history.

(56) References Cited

U.S. PATENT DOCUMENTS

| | | | | |
|---|---|---|---|---|
| 6,389,573 | B1* | 5/2002 | Weng ................... | H03M 13/15 714/784 |
| 2006/0285397 | A1* | 12/2006 | Nishihara ............... | G06F 3/061 365/185.33 |
| 2007/0043997 | A1* | 2/2007 | Yang ................. | H03M 13/2906 714/758 |
| 2008/0104460 | A1* | 5/2008 | Kanaoka .......... | G11B 20/10009 714/721 |
| 2009/0327840 | A1* | 12/2009 | Moshayedi ......... | G06F 11/1441 714/773 |
| 2012/0036414 | A1* | 2/2012 | Kaynak .............. | G11B 20/1833 714/777 |
| 2013/0139035 | A1* | 5/2013 | Zhong ................ | G11C 11/5642 714/773 |
| 2013/0326296 | A1* | 12/2013 | Choi ................ | G11C 29/50004 714/721 |
| 2016/0283320 | A1* | 9/2016 | Motwani ............ | H03M 13/1102 |

* cited by examiner

*Primary Examiner* — Guy Lamarre
(74) *Attorney, Agent, or Firm* — Dorsey & Whitney LLP

(57) ABSTRACT

Embodiments of the present invention disclose methods and apparatuses for correcting errors in data stored in a solid state device. The solid state device may have a plurality of bits stored in multi-level memory cells. The method may include identifying one or more errors in a plurality of memory cells. The method may further include converting the erroneous cells to erasures. The method may further include correcting the one or more erasures.

18 Claims, 7 Drawing Sheets

METHODS AND APPARATUSES FOR ERROR CORRECTION

BACKGROUND

Memory devices are typically provided as internal, semiconductor, integrated circuits in computers or other electronic devices. Memory may be volatile, which requires a power source to maintain its data, or non-volatile, which does not require an external power source to maintain its data. Volatile memory generally includes random-access memory (RAM), dynamic random access memory (DRAM), and synchronous dynamic random access memory (SDRAM), among others. Non-volatile memory generally includes NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory devices can be combined together to form a storage volume of a memory system such as a solid state drive (SSD). A solid state drive can include non-volatile memory (e.g., NAND flash memory and NOR flash memory), and/or can include volatile memory (e.g., DRAM and SRAM), among various other types of non-volatile and volatile memory. An SSD can have advantages over hard drives in terms of performance, size, weight, operating temperature range, and power consumption. For example, SSDs can have superior performance when compared to magnetic disk drives due to their lack of moving parts, which may avoid seek time, latency, and other electromechanical delays associated with magnetic disk drives.

Memory devices generally include memory cells which are used to store data. A memory cell of a memory device can be programmed to a desired data state. For example, a single level cell (SLC) can be programmed to one of two data states, such as a logic high or binary "1" data state and a logic low or binary "0" data state. Multi-level cells (MLCs) can be programmed to one of more than two data states. For example, some Flash MLC memory cells can be programmed to one of three, four, eight, or sixteen data states, where each of these data states is represented by a respective quantity of electric charge placed on or removed from a charge storage structure (e.g., a floating gate). As such, MLCs can allow the manufacture of higher density memories without increasing the number of memory cells since each cell can be programmed to store more than one bit.

When data is transmitted from one location to another there is the possibility that an error may occur. Errors can also occur over time while data is stored in a memory. There are a number of techniques that can be used to encode data so that an error can be detected and/or corrected. Since data is routinely transmitted to and from memory, and stored therein, memory can employ error correction techniques to attempt to correct data associated with the memory. One type of error correction involves a low-density parity-check (LDPC) technique. Unencoded, or "raw," data can be encoded into code words for transmission and/or storage. The code words can subsequently be decoded to recover the data. However, depending on the nature and extent of errors that occur to the encoded code word during transit and/or storage, a decoder may not be successful in properly decoding the code word. Error correction often involves redundant information, such as parity bits, appended to the data bits. The ratio of data bits to the total number of bits (data bits plus redundant information bits) is the code rate. ECCs with higher code rates often promote better error correction, but increase processing times and can lead to latency problems. Accordingly, efficient use of code rate is of concern when implementing an ECC.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
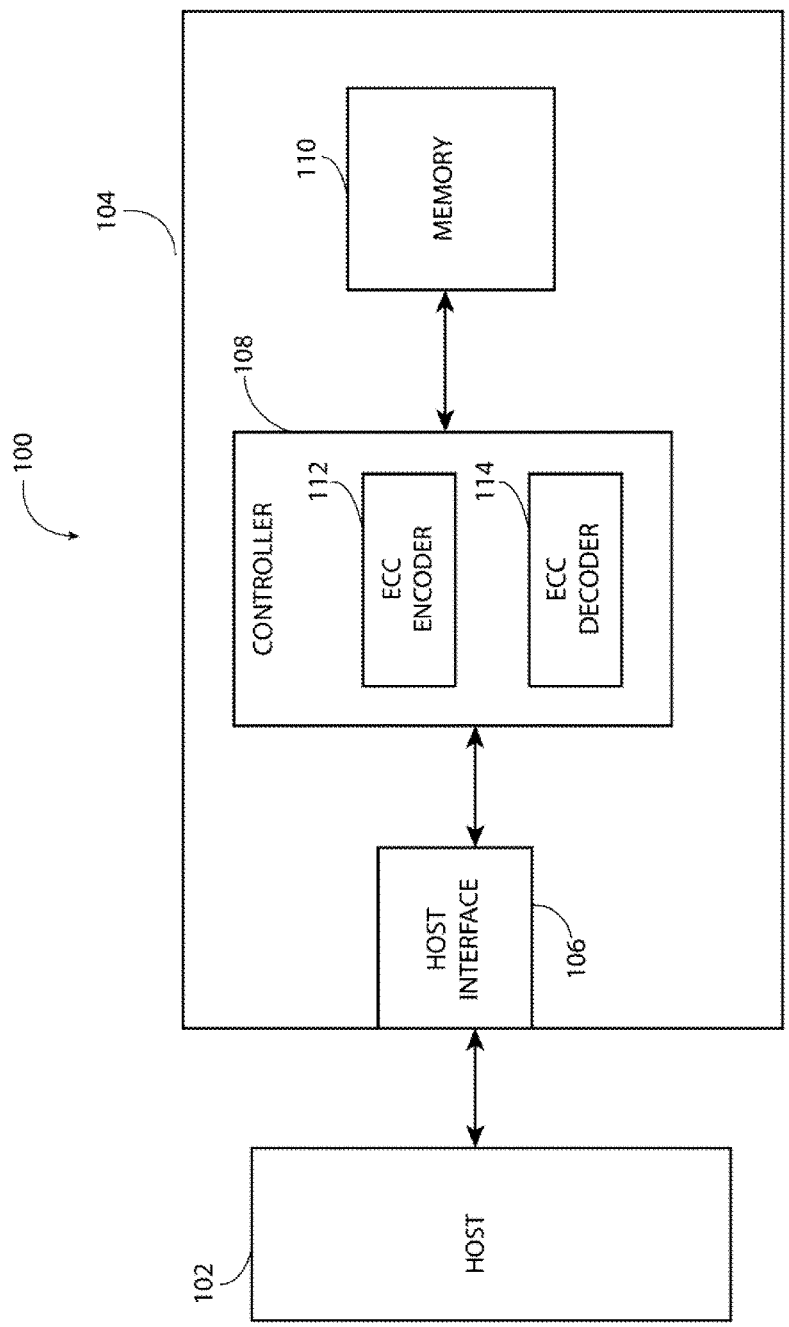
FIG. 1 is a functional block diagram of an apparatus for error correction, in accordance with an embodiment of the present invention.

Embodiments of the present invention will now be described in detail with respect to the several drawings. FIG. 1 illustrates an apparatus 100 (e.g., an integrated circuit, a memory device, a memory system, an electronic device or system, a smart phone, a tablet, a computer, a server, etc.) according to an embodiment of the disclosure. The apparatus 100 may generally include a host 102 and a memory system 104.

The host 102 may be a host system such as a personal laptop computer, a desktop computer, a digital camera, a mobile telephone, or a memory card reader, among various other types of hosts. The host 102 may include a number of memory access devices (e.g., a number of processors). The host 102 may also be a memory controller, such as where memory system 104 is a memory device (e.g., a memory device having an on-die controller).

The memory system 104 may be a solid state drive (SSD) and may include a host interface 106, a controller 108 (e.g., a processor and/or other control circuitry), and a number of memory devices 110. As used herein, the memory system 104, the controller 108, and/or the memory device 110 may also be separately considered an "apparatus." The memory 110 may comprise a number of solid state memory devices such as NAND flash devices, which provide a storage volume for the memory system 104.

The controller 108 may be coupled to the host interface 106 and to the memory 110 via a plurality of channels to transfer data between the memory system 104 and the host 102. The interface 106 may be in the form of a standardized interface. For example, when the memory system 104 is used for data storage in the apparatus 100, the interface 106 may be a serial advanced technology attachment (SATA), peripheral component interconnect express (PCIe), or a universal serial bus (USB), among other connectors and interfaces. In general, interface 106 provides an interface for passing control, address, data, and other signals between the memory system 104 and the host 102 having compatible receptors for the interface 106.

The controller 108 may communicate with the memory 110 (which in some embodiments can include a number of memory arrays on a single die) to control data read, write, and erase operations, among other operations. The controller 108 may include a discrete memory channel controller for each channel (not shown in FIG. 1) coupling the controller 108 to the memory 110. The controller 108 may include a number of components in the form of hardware and/or firmware (e.g., one or more integrated circuits) and/or software for controlling access to the memory 110 and/or for facilitating data transfer between the host 102 and memory 110.

The controller 108 may include an ECC encoder 112 for encoding data bits written to the memory 110. The ECC encoder 112 may include a single parity check (SPC) encoder, and/or an algebraic error correction circuit such as one of the group including a Bose-Chaudhuri-Hocquenghem (BCH) ECC encoder and/or a Reed Solomon ECC encoder, among other types of error correction circuits. An example ECC encoder 112 is discussed in further detail below with respect to FIGS. 3 and 4. The controller 108 may further include an ECC decoder 114 for identifying erroneous cells, converting erroneous cells to erasures, and correcting the erasures. In various embodiments, the ECC decoder 114 includes a decoder for each type of encoder in the ECC encoder 112. In certain embodiments, the ECC decoder includes a low-density parity check (LDPC) decoder for correcting erasures.

The ECC encoder 112 and the ECC decoder 114 may each be discrete components such as an application specific integrated circuit (ASIC) or the components may reflect functionality provided by circuitry within the controller 108 that does not necessarily have a discrete physical form separate from other portions of the controller 108. Although illustrated as components within the controller 108 in FIG. 1, each of the ECC encoder 112 and ECC decoder 114 may be external to the controller 108 or have a number of components located within the controller 108 and a number of components located external to the controller 108.

The memory 110 may include a number of arrays of memory cells (e.g., non-volatile memory cells). The arrays can be flash arrays with a NAND architecture, for example. However, embodiments are not limited to a particular type of memory array or array architecture. Although floating-gate type flash memory cells in a NAND architecture are generally referred to herein, embodiments are not so limited. The cells may be multi-level cells (MLC) such as triple level cells (TLC) which store three data bits per cell. The memory cells can be grouped, for instance, into a number of blocks including a number of physical pages. A number of blocks can be included in a plane of memory cells and an array can include a number of planes. As one example, a memory device may be configured to store 8 KB (kilobytes) of user data per page, 128 pages of user data per block, 2048 blocks per plane, and 16 planes per device.

According to a number of embodiments, controller 108 may be configured to control encoding of a number of received data bits according to the ECC encoder 112 that allows for later identification of erroneous bits and the conversion of those erroneous bits to erasures. The controller 108 may also control programming the encoded number of received data bits to a group of memory cells in memory 110. As described further herein, the manner in which the bits are programmed and encoded may allow for higher code rates during decoding operations and read functions.

Figure 2:
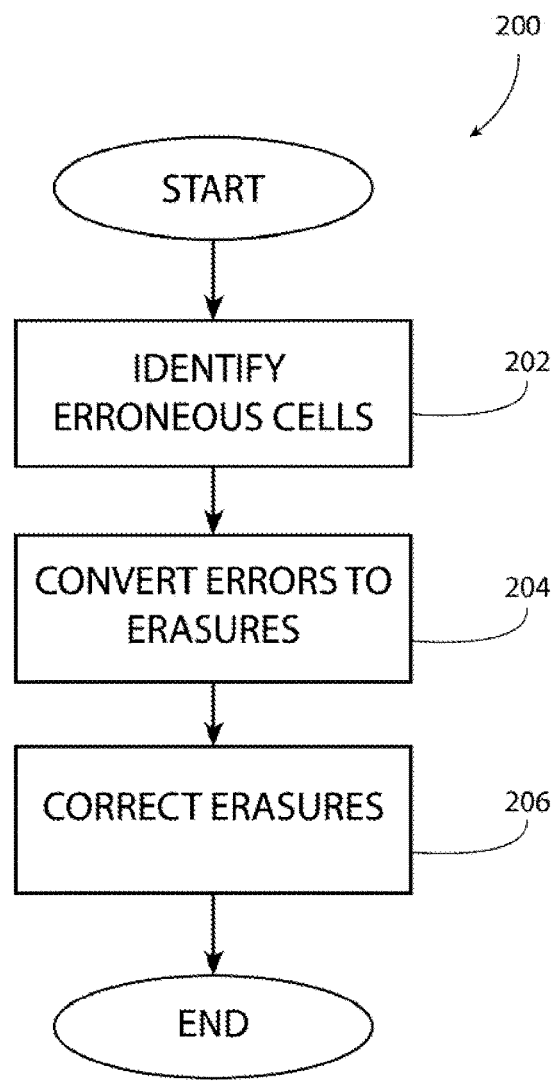
FIG. 2 is a flowchart depicting operational steps for error correction, in accordance with an embodiment of the present invention.

FIG. 2 is a flowchart depicting operational steps, generally designated 200, for error correction, in accordance with an embodiment of the present invention. In various embodiments, the operational steps 200 may be performed, wholly or in part, by the ECC decoder 114 of FIG. 1. The operational steps 200 may be embodied in hardware, such as a dedicated circuit, software, such as program instructions, firmware, or any combination thereof.

In operation 202, erroneous cells are identified. An erroneous cell may be any individual memory cell which has at least one bit in it which is in error. For example, in a TLC memory cell, if one of the three stored bits is in error, then the entire cell is determined to be erroneous and is marked as such. As will be appreciated by those skilled in the art, a number of possible strategies may be used to identify erroneous cells. In one embodiment, the data bits stored in the cells of a memory (e.g., memory 110) may be arranged and encoded to form a tensor product code. The tensor product code may employ constituent codes, such as an SPC code and/or a BCH code which increases the code rate of the ECC. The tensor product code is discussed in further detail below with respect for FIGS. 3-7. In general, any method that enables the identification of erroneous cells may be used.

In operation 204, the identified erroneous cells are converted to erasures. An erasure is a cell in which all of the bits of the cell are erased from the cell. In practice, the identification of a cell as an erasure is a signal to the ECC decoder (e.g., the ECC decoder 114) that an equal likelihood exists of each bit in the cell being a logical zero or one. That is, the memory does not have any confidence that any particular bit within the erased cell is a zero and not a one or vice versa. By converting errors to erasures, the flash channel of the memory can be converted from an errors only channel, such as a binary symmetric channel (BSC) that requires an associated confidence value for each bit, to an erasures only channel, such as a binary erasure channel (BEC) that does not require an associated confidence value. A BEC has a higher possible code rate than a BSC because the cells which were not marked as erasures are taken to be correct.

In operation 206, the erasures are corrected. In various embodiments, the erasures may be corrected using an LDPC code. Each of the bits in the erased cells has an equal probability of being a zero or a one. The correct value of each of the erased bits may be reconstructed using an LDPC code. For example, as known, an LDPC code may reconstruct a valid code word from a sequence of valid bits. The LDPC code may reconstruct the valid code word by iteratively identifying one erased bit at a time.

Figure 3:
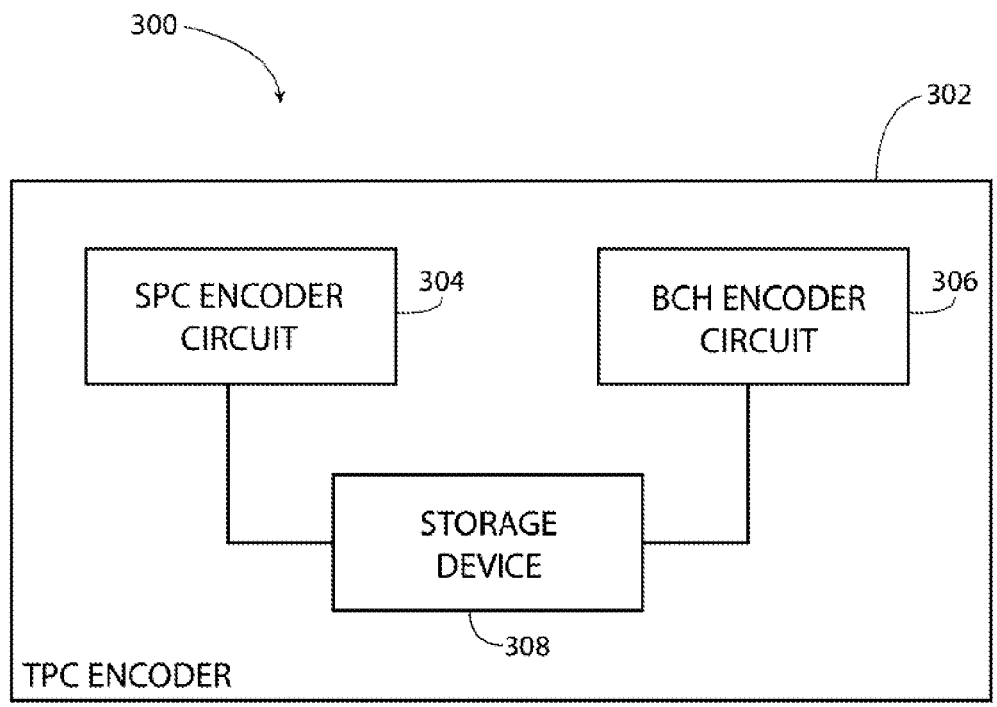
FIG. 3 is a functional block diagram of an ECC encoder, in accordance with an embodiment of the present invention.

FIG. 3 is a functional block diagram of an ECC encoder, generally designated 300, in accordance with an embodiment of the present invention. In various embodiments, the ECC encoder 300, or components thereof may be implemented as ECC encoder 112 in the embodiment of FIG. 1. The ECC encoder 300 generally includes a tensor product code (TPC) encoder 302. The TPC encoder 302 may further include an SPC encoder circuit 304, a BCH encoder circuit 306, and a storage device 308 coupled to the SPC encoder circuit 304 and the BCH encoder circuit 306.

The SPC encoder circuit 304 may be any hardware circuit, such as an integrated circuit, software application, firmware, or a combination thereof capable of receiving a plurality of bits over a data channel and generating a single parity check bit at regular intervals for the received data. In certain embodiments, a single parity check bit is generated by the SPC encoder circuit 304 for each cell of a memory (e.g., memory 110). For example, in a TLC memory device, the SPC encoder circuit 304 generates a single parity check bit for every three bits in the received data because each cell in a TLC memory stores three bits. As depicted in FIG. 3, the SPC encoder circuit 304 may form a component circuit for a larger encoding circuit (e.g., TPC encoder 302). In various embodiments, the SPC encoder circuit 304 may store the generated single parity check bits in the storage device 308.

The BCH encoder circuit 306 may be any hardware circuit, such as an integrated circuit, software application, firmware, or a combination thereof capable of accessing the storage device 308 and encoding data according to a BCH encoding method. As discussed in further detail below with respect to FIG. 4, the BCH code may be used to encode single parity check bits produced by the SPC encoder circuit 304 and stored in the storage device 308. BCH encoder circuit 306 may store the resulting BCH parity bits in the storage device 308.

The storage device 308 may be any data storage device capable of being read from and written to by the SPC encoder circuit 304 and the BCH encoder circuit 306. In various embodiments, the storage device 308 may be one of a cache memory or a register.

Figure 4:
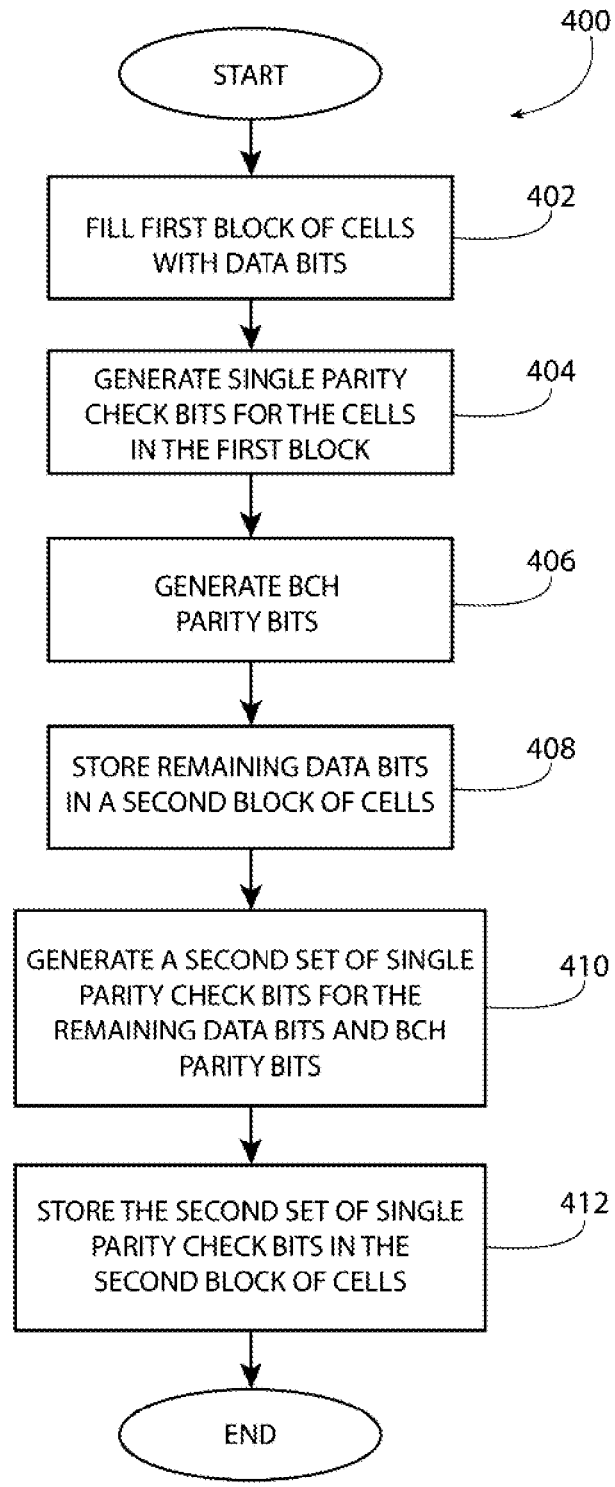
FIG. 4 is a flowchart depicting operational steps for encoding data using a tensor product code, in accordance with an embodiment of the present invention.
Figure 5:
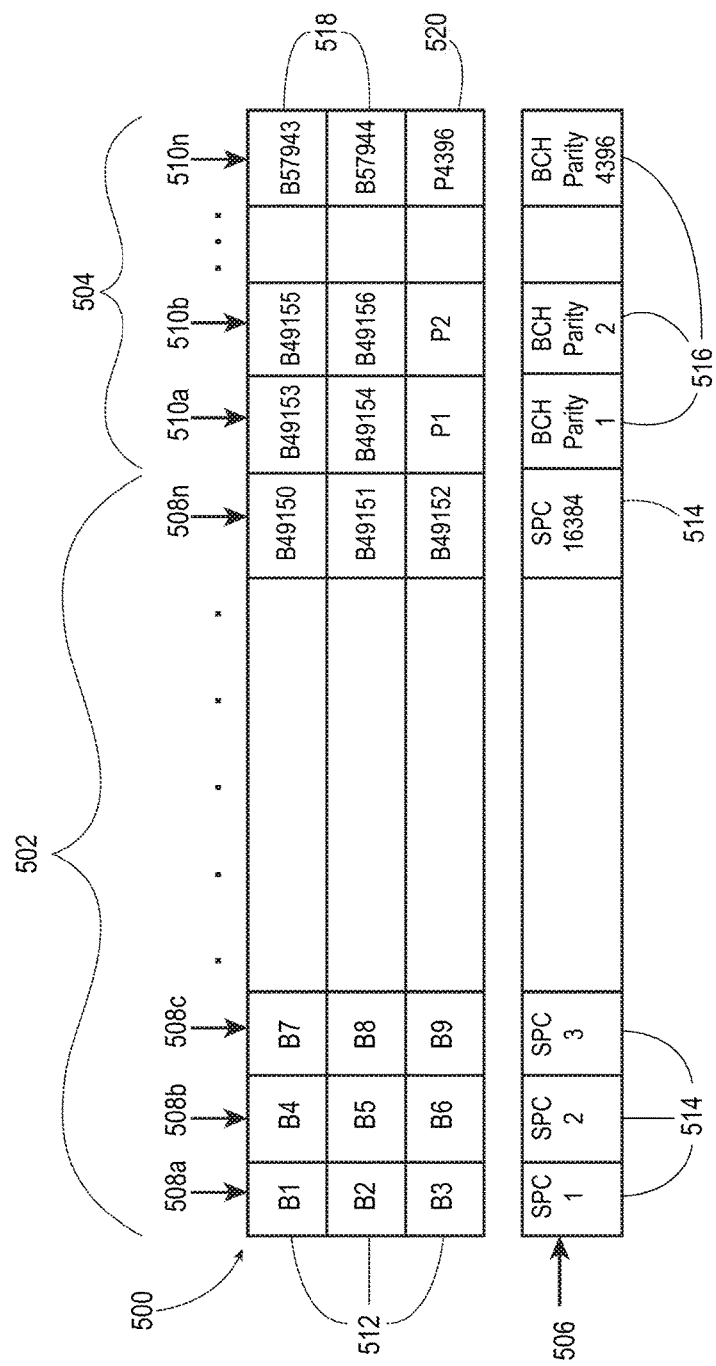
FIG. 5 is an example tensor product code with enabling bits, in accordance with an embodiment of the present invention.

FIGS. 4 and 5 will now be discussed in conjunction. FIG. 4 is a flowchart depicting operational steps, generally designated 400, for encoding data in a tensor product code (TPC) configuration, such as TPC 500 depicted in FIG. 5, in accordance with an embodiment of the present invention. In various embodiments, the operational steps of FIG. 4 may be performed, wholly or in part, by a controller, such as controller 108 having an ECC encoder, such as ECC encoder 112 or ECC encoder 300.

In operation 402, the controller fills a first block of cells with data bits. As shown in FIG. 5, the TPC 500 may be divided into a first block 502 and a second block 504. The first block 502 may have a plurality of memory cells 508a-508n. In various embodiments, the number of data bits stored in and the size of the first and second blocks of cells depend on the total number of bits to be encoded using a tensor product code, such as TPC 500, the number of bits which can be stored in a cell, and the constituent codes of the TPC. For example, if the TPC uses a BCH code (see operation 406 below), then the total number of bits stored in the first and second block of cells may depend on the number of BCH parity bits generated, which may be predetermined, as those skilled in the art will appreciate. In a TLC memory device, as shown in FIG. 5, each of the memory cells 508a-508n may store three bits 512. For example, if there are 57,944 total data bits 512 to be stored in the TPC 500, then the first 49,152 data bits are stored, three bits per cell, in the first block 502 of 16,384 memory cells 508a-508n in operation 402.

In operation 404, the controller generates single parity check bits for the cells in the first block. In various embodiments, the controller generates the single parity check bits using an SPC encoder circuit, such as SPC encoder circuit 304. The controller may add the bits, modulo 2, in each cell and generate a single parity check bit, whose value indicates whether the sum of the bits in the cell is odd or even. For example, if the bits stored in the cell are 010, then the sum of the bits is odd, so the single parity check bit may have a value of 1. Similarly, if the bits stored in the cell are 101, then the sum of the bits is even, and the single parity check bit may have a value of 0. In certain embodiments, the single parity check bits are stored as associated enabling bits in an associated storage device, such as storage device 308, which may be a local cache or register. The embodiment of FIG. 5 shows a plurality of enabling bits 706. The enabling bits may include single parity check bits 514 stored as enabling bits in the associated storage device 308.

In operation 406, the controller generates a plurality of BCH parity bits. The controller may generate the plurality of BCH parity bits using a BCH encoder circuit, such as BCH encoder circuit 306. In various embodiments, the controller generates the BCH parity bits by using the single parity check bits generated in operation 404 as the data to be encoded. The generated BCH parity bits may be stored as associated enabling bits in a local storage device, such as storage device 308, which may be a cache or a register. As shown in FIG. 5, the enabling bits 506 may include a number of associated BCH parity bits 516.

In operation 408, the controller stores the remaining data bits in a second block of cells. As shown in FIG. 5, the remaining bits may be stored in the second block 504 of memory cells 510a-510n. The remaining bits may be stored so as to leave an open bit in each cell. For example, if the memory is a TLC memory, then each of the memory cells 510a-510n in the second block 504 has two data bits 518 stored therein. In various embodiments, the number of cells in the second block of cells is equal to the number of BCH parity bits 516 generated in operation 406 and stored as enabling bits 506. For example, if in operation 506, the single parity check bits 514 are encoded using a (20,780, 16,384) BCH code, then the second block 504 of cells may have at least (20,780−16,384)=4,396 cells 710a-710n. The second block of cells may, therefore, store 8,792 data bits (4,396 cells×2 data bits/cell). When combined with the first block of cells, the total number of data bits stored in the memory is 57,944 (49,152 data bits in the first block of cells+8792 data bits in the second block of cells), as stated above with respect to operation 402.

In operation 410, the controller generates a second set of single parity check bits for the data bits stored in the second block and the BCH parity bits. As shown in FIG. 5, the second set of single parity check bits may be stored in cells 510a-510n of the second block 504 as single parity check bits 520. The controller may generate the second set of single parity check bits 520 using an SPC encoder circuit, such as SPC encoder circuit 304. In various embodiments, the controller adds the values of the data bits (e.g., data bits 518) stored in a cell (e.g., cell 510a) of the second block 504 of cells with one of the BCH parity bits generated in operation 406 (e.g., BCH parity bits 516) and stored in the enabling bits 506. For example, in a TLC memory, the controller adds the values of the two bits in the first cell in the second block with the first BCH parity bit generated in operation 406. If the sum of the bits is even, then the second SPC parity bit may be a 0, and if the sum of the bits is odd, then the second single parity check bit may be a 1. As discussed above, the number of cells in the second block may be equal to the number of BCH parity bits generated in operation 406.

In operation 412, the controller stores each of the second set of single parity check bits in the second block of cells. As discussed above, an open bit was left in each of the cells (e.g., cells 510a-510n) of the second block (e.g., second block 504) when the remaining data bits were stored in the second block of cells (see operation 408). The controller stores the second set of single parity check bits in the open bits in the second block of cells. In various embodiments, the second single parity check bit stored in each cell is the parity check bit representing the sum of the two data bits in that cell and a BCH parity bit. As shown in FIG. 5, the each cell 510a-510n in the second block 504 contains two data bits 518 and a single parity check bit 520 representing the sum of the two data bits 518 and a BCH parity bit 516 stored in the enabling bits 506. Accordingly, the number of second single parity check bits stored in operation 412 may be equal to the number of cells in the second block of cells. In the embodiment of FIG. 5, 4,396 BCH parity bits 516 are stored in the enabling bits 504, and 4,396 cells 510a-510n each have two data bits 518 stored in them. Accordingly, operation 410 generates 4,396 single parity check bits 520 and stores them in cells 510a-510n of the second block 504 of the TPC 500. The first and second blocks of memory together may constitute a tensor product code configuration consisting of all of the data bits 512 and 518 and a number of additional single parity check bits 520. The first set of single parity check bits and the BCH parity bits are not written to the memory and therefore do not form part of the tensor product code. As one skilled in the art will appreciate, because the single parity check bits for the cells in the first block and the BCH parity bits are not stored in the memory (e.g., memory 110), the code rate may be improved. For example, in the embodiment with 57,944 data bits, the code rate is 57,944/(57,944+4,396)=0.9295.

Figure 6:
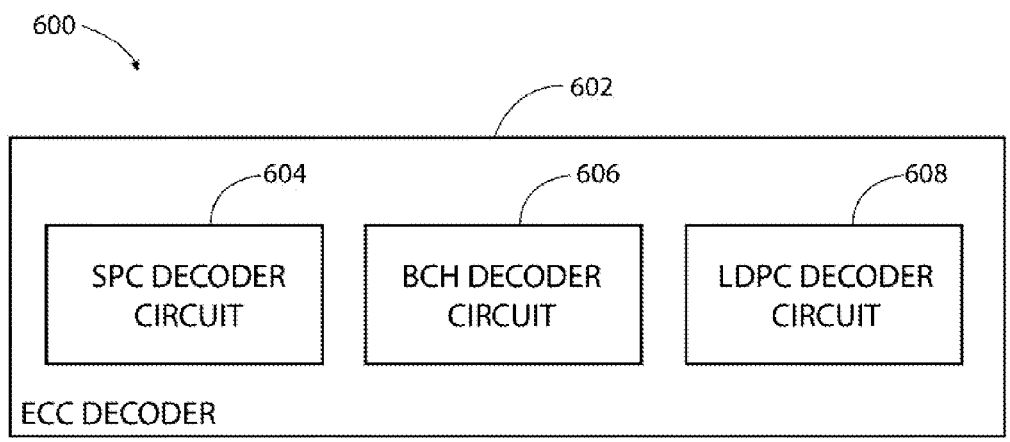
FIG. 6 is a functional block diagram of an ECC decoder, in accordance with an embodiment of the present invention.

FIG. 6 is a functional block diagram of an ECC decoder, generally designated 600, in accordance with an embodiment of the present invention. In various embodiments, ECC decoder 600 may be implemented as the ECC decoder 114 in FIG. 1. ECC decoder 600 generally includes TPC decoder 602, which includes an SPC decoder circuit 604, a BCH decoder circuit 606, and an LDPC decoder circuit 608.

The TPC decoder 602 may generally be any decoder circuit, or combination of decoder circuits, capable of identifying erroneous cells in a TPC and converting the erroneous cells to erasures. In various embodiments, the TPC decoder 602 and its components may be implemented as a hardware circuit, such as an integrated circuit, software application, firmware, or a combination thereof.

The SPC decoder circuit 604 may be any hardware circuit, such as an integrated circuit, software application, firmware, or a combination thereof capable of receiving a plurality of bits over a data channel and generating a single parity check bit at regular intervals for the received data. In certain embodiments, a single parity check bit is generated by the SPC decoder circuit 604 for each cell of a memory (e.g., memory 110). For example, in a TLC memory device, the SPC decoder circuit 604 generates a single parity check bit for every three bits in the received data because each cell in a TLC memory stores three bits. As depicted in FIG. 6, the SPC decoder circuit 604 may form a component circuit for a larger decoding circuit (i.e., TPC decoder 602) which identifies errors in the data that occur between encoding and decoding and converts the errors to erasures.

The BCH decoder circuit 606 may be any hardware circuit, such as an integrated circuit, software application, firmware, or a combination thereof capable of decoding data according to a BCH encoding method. As discussed in further detail below with respect to FIG. 7, the BCH decoder may be used to decode single parity check bits generated from the tensor product code (e.g., a tensor product code generated according to the operational steps of FIG. 4). According to some embodiments, the BCH decoder circuit 606 may identify particular cells in a memory (e.g., memory 110) which contain at least one erroneous bit. The cells identified by the BCH decoder 606 may be converted to erasures and passed to an LDPC decoder for error correction.

The LDPC decoder circuit 608 may be any hardware circuit, such as an integrated circuit, software application, firmware, or a combination thereof capable of receiving erasures from the BCH decoder circuit 606 and correcting the erasures. For example, an LDPC code may reconstruct a valid code word from a sequence of valid bits and erasures. The LDPC code may then reconstruct the valid code word by iteratively identifying one erased bit at a time.

Figure 7:
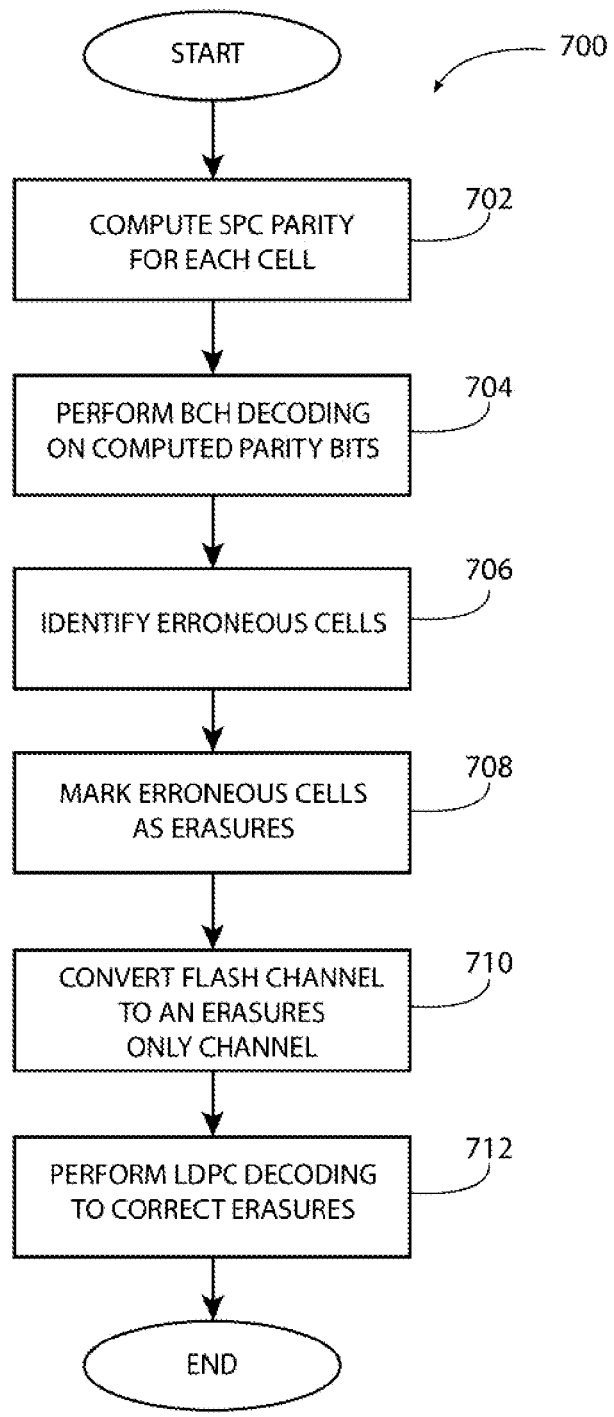
FIG. 7 is a flowchart depicting operational steps for decoding data using a tensor product code, in accordance with an embodiment of the present invention.

FIG. 7 is a flowchart depicting operational steps for decoding data using a tensor product code, in accordance with an embodiment of the present invention. In various embodiments, the operational steps of FIG. 7 may be performed, wholly or in part, by a controller, such as controller 108 having an ECC decoder, such as ECC decoder 114 or ECC decoder 600.

In operation 702, the controller computes an SPC parity bit for each cell in the memory (e.g., memory 110). In various embodiments, operation 702 may be performed by the SPC decoder circuit 604 as discussed above with respect to FIG. 6. The SPC parity bits may be computed in a similar manner as described above. For example, in a TLC, each cell has three bits stored in it. The three bits may be added together and the SPC parity represents whether the sum of the bits is odd or even (e.g., 0 for even and 1 for odd). The computed parity bits for the cells may constitute a BCH code word which may be decoded using BCH decoding (e.g., a BCH decoder which decodes data encoded using BCH encoder circuit 306).

In operation 704, the controller performs BCH decoding on the computed SPC parity bits. In various embodiments, BCH decoding may be performed by the BCH decoder circuit 606 as discussed above with respect to FIG. 6. BCH decoding may identify errors in the BCH code word that occur between the time of encoding and the time of decoding. For example, in a TLC, a cell may, at the time of encoding, have a parity bit of 1 (as calculated in operation 504 or 506 of FIG. 4). At the time of decoding, if an error occurred in the cell (e.g., one of the data bits switched from a 0 to a 1 or vice versa) then the parity bit calculated in operation 704 may be a 0 instead of a 1.

In operation 706, the controller identifies erroneous cells. Because each of the parity bits corresponds to a single cell in the memory, if the bits in the BCH code words at the time of encoding and decoding do not match, then the cell corresponding to that bit in the BCH code word is in error. Further, the location of the erroneous cell may be identified by the parity bits because of the one-to-one correspondence between the parity bits and the memory cells (e.g., the first parity corresponds to the first cell, etc.).

In operation 708, the controller marks the erroneous cells as erasures. Marking a cell as an erasure may include assigning a value of a log-likelihood-ratio (LLR) of 0 to each bit in the cell. Accordingly, after operation 708, the cells in memory may all either be cells which can be read with 100% confidence in their accuracy, or passed as erasures to a subsequent circuit or module which can reconstruct the data in the erased cells (e.g., by an LDPC code). Operation 708 may remove all errors from the memory In operation 710, the controller converts the flash channel of the memory to an erasures only channel from an errors only channel. By identifying the errors and converting the errors to erasures prior to transferring the data to a final decoder circuit (e.g., LDPC decoder circuit 608), the controller can take advantage of a higher capacity erasures only channel. Erasures only channels have higher capacity than errors only channels, which means that a higher code rate is achievable on an erasures only channel than an errors only channel.

In operation 712, the controller performs LDPC decoding to correct the erasures. For example, an LDPC code may reconstruct a valid code word from a sequence of valid bits and erasures by reconstructing one erased bit at a time.

What is claimed is:

1. An apparatus comprising:
a memory device having a plurality of multi-level cells;
an encoder circuit coupled to the memory device and configured to store a first plurality of data bits in first multi-level cells of the plurality of multi-level cells and to store a second plurality of data bits in second multi-level cells of the plurality of multi-level cells, and further configured to store parity check bits in the second multi-level cells with the second plurality of data bits, wherein the parity check bits are based on first parity bits and the second plurality of data bits and the first parity bits are based on second parity bits for the first plurality of data bits, and wherein the first and second plurality of data bits, and the parity check bits are stored in the plurality of multi-level cells in a tensor product code configuration; and
a decoder circuit coupled to the memory device and configured to identify one or more erroneous cells in the plurality of multi-level cells, erase data bits stored in the one or more erroneous cells, convert a flash channel associated with the plurality of multi-level cells from an errors channel to an erasures channel, and perform low density parity check decoding.

2. The apparatus of claim 1, wherein the encoder circuit comprises:
a single parity check encoder circuit configured to calculate parity bits for a plurality of bits; and
a Bose-Chaudhuri-Hocquenghem (BCH) encoder configured to calculate a plurality of BCH parity bits.

3. The apparatus of claim 2, wherein the encoder circuit comprises:
a storage device for storing at least some of the parity bits and the BCH parity bits.

4. The apparatus of claim 1, wherein the decoder circuit comprises:
a single parity check decoder circuit configured to calculate parity bits for a plurality of bits; and
a BCH decoder circuit configured to identify erroneous cells in the memory device.

5. The apparatus of claim 1, wherein the decoder circuit comprises a low density parity check decoder circuit configured to correct the one or more erroneous cells.

6. An apparatus comprising:
a memory device having a first plurality of data bits stored in first plurality of multi-level memory cells, a second plurality of data bits stored in a second plurality of multi-level memory cells, and further having parity check bits stored with the second plurality of data bits in the second plurality of multi-level memory cells, wherein the first and second plurality of data bits and the parity check bits are stored in the first and second plurality of multi-level cells in a tensor product code configuration; and
a controller coupled to the memory device and configured to identify one or more erroneous multi-level memory cells, erase data bits stored in the one or more erroneous multi-level memory cells, convert a flash channel associated with the plurality of multi-level memory cells from an errors channel to an erasures channel, and perform low density parity check decoding.

7. The apparatus of claim 6, wherein the tensor product code configuration comprises the plurality of user bits and a plurality of tensor product code parity bits.

8. The apparatus of claim 7, wherein the controller comprises:
an encoder circuit configured to generate a first BCH code word and the plurality of tensor product code parity bits for the plurality of multi-level memory cells; and
a decoder circuit configured to generate a second BCH code word based on the plurality of tensor product code parity bits.

9. A method comprising:
identifying one or more errors in a plurality of memory cells having a plurality of data bits encoded thereon in a tensor product code, wherein the tensor product code includes a first plurality of data bits stored in first memory cells of the plurality of memory cells, a second plurality of data bits stored in second memory cells of the plurality of memory cells, and parity check bits stored in the second memory cells of the plurality of memory cells with the second plurality of data bits, and wherein fewer data bits are stored in the second memory cells of the plurality of memory cells than the data bits stored in the first memory cells of the plurality of memory cells; and
erasing data bits stored in one or more erroneous cells of the plurality of memory cells, converting a flash channel associated with the plurality of memory cells from an errors channel to an erasures channel, and performing low density parity check decoding.

10. The method of claim 9, wherein each of the plurality of memory cells is a multi-level cell.

11. The method of claim 9, wherein the tensor product code comprises a single parity check code and a Bose-Chaudhuri-Hocquenghem code.

12. A method comprising:
storing a first set of data bits in a first plurality of memory cells; determining a first set of parity bits for the first plurality of memory cells; determining a Bose-Chaudhuri-Hocquenghem (BCH) parity bit for each of the parity bits in the first set of parity bits;
storing a second set of data bits in a second plurality of memory cells;
determining a second set of single parity check (SPC) parity-bits for the second set of data bits and the BCH parity bits;
storing the second set of single parity check (SPC) bits in the second plurality of memory cells;
decoding the second set of parity bits to generate a BCH code word; identifying one or more erroneous cells in the first and second plurality of memory cells based on the BCH code word;
erasing data bits stored in the one or more erroneous cells;
converting a flash channel associated with the first and second plurality of memory cells from an errors channel to an erasures channel; and
performing low density parity check decoding.

13. The method of claim 12, wherein identifying the one or more one or more erroneous cells comprises:
    comparing the BCH code word to the first set of parity bits and the BCH parity bits.

14. The method of claim 12, wherein the first and second plurality of memory cells are multi-level cells.

15. A method comprising:
    storing a first plurality of data bits in a first plurality of multi-level memory cells;
    encoding the first plurality of bits according to a tensor product code to generate a first plurality of parity bits;
    encoding a second plurality of data bits and the first plurality of parity bits according to the tensor product code to generate a second plurality of parity bits;
    storing the second plurality of data bits and the second plurality of parity bits in a second plurality of multi-level memory cells;
    identifying one or more erroneous cells in at least one of the first and second plurality of multi-level memory cells;
    erasing data bits stored in the one or more erroneous cells;
    converting a flash channel associated with the first and second plurality of multi-level memory cells from an errors channel to an erasures channel; and
    performing low density parity check decoding.

16. The method of claim 15, wherein the tensor product code comprises a single parity check code and a Bose-Chaudhuri-Hocquenghem code.

17. The method of claim 15, wherein identifying the one or more erroneous cells comprises:
    decoding the second plurality of data bits according to the tensor product code to generate a code word.

18. The method of claim 17, wherein identifying the one or more erroneous cells further comprises:
    comparing one or more bits in the code word to a corresponding bit in the first plurality of parity bits; and
    identifying one or more differences between the one or more bits in the code word and the corresponding bits in the first plurality of parity bits.

\* \* \* \* \*